(12) United States Patent
Torardi et al.

(10) Patent No.: US 10,658,528 B2
(45) Date of Patent: May 19, 2020

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Carmine Torardi, Wilmington, DE (US); Paul Douglas Vernooy, Hockessin, DE (US); Qijie Guo, Hainesport, NJ (US); Brian J Laughlin, Lincoln University, PA (US); Giuseppe Scardera, Sunnyvale, CA (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 215 days.

(21) Appl. No.: 15/948,206

(22) Filed: Apr. 9, 2018

(65) Prior Publication Data

US 2018/0301574 A1    Oct. 18, 2018

Related U.S. Application Data

(60) Provisional application No. 62/486,709, filed on Apr. 18, 2017.

(51) Int. Cl.
*H01L 31/0224*    (2006.01)
*H01L 31/068*    (2012.01)
(Continued)

(52) U.S. Cl.
CPC ........ *H01L 31/022425* (2013.01); *C09D 1/00* (2013.01); *C09D 5/24* (2013.01);
(Continued)

(58) Field of Classification Search
CPC .... C09D 5/24; C09D 1/00; C09D 7/61; H01L 31/02168; H01L 31/022425;
(Continued)

(56) References Cited

U.S. PATENT DOCUMENTS 4,293,451 A    10/1981    Ross
4,643,913 A    2/1987    Okunaka et al.
(Continued)

FOREIGN PATENT DOCUMENTS

CN    1060280 A    4/1992
CN    1873836 A    12/2006
(Continued)

OTHER PUBLICATIONS

Zhang, Yaping et al., Effect of the interface glass on electrical performance of screen printed Ag thick-film contacts of Si solar cells, Thin Solid Films, 2010, pp. e111-e113, vol. 518.
(Continued)

*Primary Examiner* — Brittany L Raymond

(57) ABSTRACT

The present invention provides a thick-film paste composition comprising an electrically conductive metal and an oxide composition dispersed in an organic medium. The paste composition is printed on the front side of a solar cell device having one or more insulating layers and fired to form an electrode, and is suitable for devices having both highly and lightly doped emitter structures.

15 Claims, 1 Drawing Sheet

(51) Int. Cl.
| | |
|---|---|
| *H01L 31/0216* | (2014.01) |
| *H01L 31/18* | (2006.01) |
| *H01B 1/22* | (2006.01) |
| *C09D 5/24* | (2006.01) |
| *C09D 1/00* | (2006.01) |
| *C09D 7/61* | (2018.01) |
| *H01L 31/048* | (2014.01) |
| *H01L 31/0288* | (2006.01) |
| *H01L 31/0352* | (2006.01) |

(52) U.S. Cl.
CPC .............. *C09D 7/61* (2018.01); *H01B 1/22* (2013.01); *H01L 31/02168* (2013.01); *H01L 31/0481* (2013.01); *H01L 31/068* (2013.01); *H01L 31/1804* (2013.01); *H01L 31/0288* (2013.01); *H01L 31/035272* (2013.01)

(58) Field of Classification Search
CPC ......... H01L 31/0288; H01L 31/035272; H01L 31/0481; H01L 31/068; H01L 31/1804; H01B 1/22
See application file for complete search history.

(56) References Cited

U.S. PATENT DOCUMENTS

| | | | |
|---|---|---|---|
| 4,945,071 | A | 7/1990 | Friesen et al. |
| 5,013,697 | A | 5/1991 | Akhtar |
| 5,066,621 | A | 11/1991 | Akhtar |
| 5,118,362 | A | 6/1992 | St et al. |
| 5,188,990 | A | 2/1993 | Dumesnil et al. |
| 5,240,884 | A | 8/1993 | Herrington et al. |
| 5,245,492 | A | 9/1993 | Mizuno et al. |
| 5,334,558 | A | 8/1994 | Dietz et al. |
| 5,336,644 | A | 8/1994 | Akhtar et al. |
| 5,594,406 | A | 1/1997 | Koyama et al. |
| 5,616,173 | A | 4/1997 | Okamoto et al. |
| 5,663,109 | A | 9/1997 | Dietz et al. |
| 6,204,443 | B1 | 3/2001 | Kiso et al. |
| 7,494,607 | B2 | 2/2009 | Wang et al. |
| 7,537,713 | B2 | 5/2009 | Satou et al. |
| 7,608,206 | B1 | 10/2009 | Vernooy et al. |
| 7,736,546 | B2 | 6/2010 | Prunchak |
| 7,871,949 | B2 | 1/2011 | Lee et al. |
| 7,910,393 | B2 | 3/2011 | Kim et al. |
| 7,951,311 | B2 | 5/2011 | Vernooy et al. |
| 8,313,673 | B2 | 11/2012 | Wang et al. |
| 8,383,017 | B2 | 2/2013 | Carroll et al. |
| 8,470,723 | B2 | 6/2013 | Naito et al. |
| 8,497,420 | B2 | 7/2013 | Carroll et al. |
| 8,512,463 | B2 | 8/2013 | Hang |
| 8,546,281 | B2 | 10/2013 | Lee et al. |
| 8,696,948 | B2 | 4/2014 | Hang et al. |
| 8,771,554 | B2 | 7/2014 | Rajendran |
| 8,889,041 | B2 | 11/2014 | Sridharan et al. |
| 8,889,979 | B2 | 11/2014 | Carroll et al. |
| 8,889,980 | B2 | 11/2014 | Carroll et al. |
| 8,895,843 | B2 | 11/2014 | Carroll et al. |
| 9,722,100 | B2 | 8/2017 | Carroll et al. |
| 2006/0102228 | A1 | 5/2006 | Sridharan et al. |
| 2006/0231800 | A1 | 10/2006 | Wang et al. |
| 2006/0231803 | A1 | 10/2006 | Wang et al. |
| 2006/0231804 | A1 | 10/2006 | Wang et al. |
| 2006/0272700 | A1 | 12/2006 | Young et al. |
| 2008/0223446 | A1 | 9/2008 | Wang et al. |
| 2009/0095344 | A1 | 4/2009 | Machida et al. |
| 2009/0189126 | A1 | 7/2009 | Prunchak |
| 2009/0199897 | A1 | 8/2009 | Naito et al. |
| 2009/0255584 | A1 | 10/2009 | Carroll |
| 2009/0298283 | A1 | 12/2009 | Akimoto et al. |
| 2010/0135849 | A1 | 6/2010 | Gu et al. |
| 2010/0163101 | A1 | 7/2010 | Kumar et al. |
| 2010/0180934 | A1 | 7/2010 | Naito et al. |
| 2010/0275987 | A1 | 11/2010 | Sakamoto et al. |
| 2011/0094578 | A1 | 4/2011 | Akimoto et al. |
| 2011/0095240 | A1 | 4/2011 | Nakamura et al. |
| 2011/0192456 | A1 | 8/2011 | Hang et al. |
| 2011/0192457 | A1 | 8/2011 | Nakayama et al. |
| 2011/0232746 | A1 | 9/2011 | Carroll et al. |
| 2011/0232747 | A1 | 9/2011 | Mikeska et al. |
| 2011/0308595 | A1 | 12/2011 | Carroll et al. |
| 2011/0308596 | A1 | 12/2011 | Carroll et al. |
| 2011/0308597 | A1 | 12/2011 | Carroll et al. |
| 2011/0315937 | A1 | 12/2011 | Aoyagi et al. |
| 2012/0067415 | A1 | 3/2012 | Tachizono et al. |
| 2013/0049148 | A1 | 2/2013 | Hang et al. |
| 2013/0099177 | A1 | 4/2013 | Rajendran |
| 2013/0099178 | A1 | 4/2013 | Hang et al. |
| 2013/0186463 | A1 | 7/2013 | Wang et al. |
| 2013/0255767 | A1 | 10/2013 | Carroll et al. |
| 2013/0255768 | A1 | 10/2013 | Carroll et al. |
| 2013/0255769 | A1 | 10/2013 | Carroll et al. |
| 2013/0255770 | A1 | 10/2013 | Carroll et al. |
| 2013/0298982 | A1 | 11/2013 | Hang et al. |

FOREIGN PATENT DOCUMENTS

| | | |
|---|---|---|
| CN | 101055896 A | 10/2007 |
| CN | 101164934 A | 4/2008 |
| CN | 102496404 A | 6/2012 |
| CN | 104726085 A | 6/2015 |
| CN | 107424662 A | 12/2017 |
| EP | 0430206 A1 | 6/1991 |
| EP | 0463826 A1 | 1/1992 |
| EP | 0466295 A1 | 1/1992 |
| EP | 0537886 A1 | 4/1993 |
| EP | 0393416 B1 | 6/1993 |
| EP | 1713091 B1 | 9/2010 |
| JP | 59-033869 A | 2/1984 |
| JP | 62-036040 A | 2/1987 |
| JP | 01-138150 A | 5/1989 |
| JP | 02-293344 A | 12/1990 |
| JP | 03-218943 A | 9/1991 |
| JP | 04-224178 A | 8/1992 |
| JP | 04-270140 A | 9/1992 |
| JP | 05-105484 A | 4/1993 |
| JP | 05-175254 A | 7/1993 |
| JP | 08-097011 A | 4/1996 |
| JP | 08-138438 A | 5/1996 |
| JP | 09-092027 A | 4/1997 |
| JP | 10-340621 A | 12/1998 |
| JP | 2001-284754 A | 10/2001 |
| JP | 2006-093433 A | 4/2006 |
| JP | 2006-302890 A | 11/2006 |
| JP | 2006-302891 A | 11/2006 |
| JP | 2008-520094 A | 6/2008 |
| JP | 2009-099781 A | 5/2009 |
| JP | 2010-238955 A | 10/2010 |
| JP | 2010-251645 A | 11/2010 |
| JP | 2010-283340 A | 12/2010 |
| JP | 2011-018425 A | 1/2011 |
| JP | 2011-118425 A | 6/2011 |
| JP | 2014-093312 A | 5/2014 |
| KR | 10-1990-0016060 A | 11/1990 |
| KR | 10-2006-0108547 A | 10/2006 |
| KR | 10-2008-0022088 A | 3/2008 |
| TW | I611428 | 1/2018 |
| WO | 92/00924 A1 | 1/1992 |
| WO | 92/00925 A1 | 1/1992 |
| WO | 2006/132766 A2 | 12/2006 |
| WO | 2008/134417 A1 | 11/2008 |
| WO | 2009/052356 A2 | 4/2009 |
| WO | 2010/123967 A2 | 10/2010 |
| WO | 2012/099877 A1 | 7/2012 |
| WO | 2012/116052 A1 | 8/2012 |
| WO | 2012/129554 A2 | 9/2012 |

OTHER PUBLICATIONS

Zhang, Yaping et al., "Thermal Properties of Glass Frit and Effects on Si Solar Cells", Materials Chemistry and Physics, vol. 114, 2009, 319-322.

(56) References Cited

OTHER PUBLICATIONS

Scotten W. Jones, "Diffusion in Silicon", IC Knowledge LLC, Apr. 25, 2008.
Rane, B. et al., "Firing and processing effects on microstructure of fritted silver thick film electrode materials for solar cells", Materials Chemistry and Physics, vol. 82, 2003, pp. 237-245.
PCT International Search Report for Application No. PCT/US2012/030475; Marsitzky, Dirk, Authorized Officer; ISA/EPO; dated Oct. 10, 2012.
PCT International Search Report for Application No. PCT/US2012/026085; Marsitzky, Dirk, Authorized Officer; ISA/EPO; dated Jul. 26, 2012.
PCT International Search Report for Application No. PCT/US2011/035167; Marsitzky, Dirk, Authorized Officer; ISA/EPO; dated Sep. 26, 2011.
PCT International Search Report for Application No. PCT/US2011/035154; Marsitzky, Dirk, Authorized Officer; ISA/EPO; dated Sep. 23, 2011.
PCT International Search Report for Application No. PCT/US2011/035145; Marsitzky, Dirk, Authorized Officer; ISA/EPO; dated Sep. 27, 2011.
PCT International Search Report for Application No. PCT/US2011/035139; Marsitzky, Dirk, Authorized Officer; ISA/EPO; dated Sep. 26, 2011.
PCT International Search Report for Application No. PCT/US2011/035131; Marsitzky, Dirk, Authorized Officer; ISA/EPO; dated Sep. 26, 2011.
Larry, J. R., et al., "Thick-Film Technology: An Introduction to the Materials", IEEE Transactions on Components, Hybrids, and Manufacturing Technology, vol. CHMT-3, No. 2, Jun. 1980.
Kurihara, Yasutoshi et al., "Ag—Pd Thick Film Conductor for Ain Ceramics", IEEE Transactions on Components, Hybrids, and Manufacturing Technology, vol. 13(2), 1990, 306-312.
Journal of the Ceramic Association, Japan, 1968, vol. 76 (873), p. 160-172.
Janoch, R. et al., "Contact Resistance Measurement—Observations on Technique and Test Parameters", 42nd IEEE 30 Photovoltaic Specialists Conference, Jun. 14-19, 2015, New Orleans, LA.
Hilali, M., "Understanding and Development of Manufacturable Screen-Printed Contacts on High Sheet-Resistance Emitter for Low-Cost Silicon Solar Cells", A Thesis Presented to the Academic Faculty, Georgia Institute of Technology, Aug. 2005.
Blakers, A. W. et al., "22.8% efficient silicon solar cell", Applied Physics Letters, vol. 55, Sep. 25, 1989, pp. 1363-1365.

CONDUCTIVE PASTE COMPOSITION AND SEMICONDUCTOR DEVICES MADE THEREWITH

FIELD OF THE INVENTION

The present disclosure relates to a conductive paste composition that is useful in the construction of a variety of electrical and electronic devices, and more particularly to a paste composition useful in creating conductive structures, including electrodes that provide low contact resistance connection to photovoltaic devices, devices constructed with such paste compositions, and a process for constructing these devices.

TECHNICAL BACKGROUND

A conventional photovoltaic cell incorporates a semiconductor structure with a junction between semiconducting materials with different majority-carrier conductivity types, such as a p-n junction formed between an n-type semiconductor and a p-type semiconductor. More specifically, crystalline Si photovoltaic cells are typically made by adding controlled impurities (called dopants) to purified silicon, which is an intrinsic semiconductor. Dopants from IUPAC group 13 (e.g., B) are termed "acceptor dopants" and produce p-type material, in which the majority charge carriers are positive "holes," or electron vacancies. Dopants from IUPAC group 15 (e.g., P) are termed "donor dopants" and produce n-type material, in which the majority charge carriers are negative electrons. Dopants may be added to bulk materials by direct inclusion in the melt during silicon crystal growth. Doping of a surface is ordinarily accomplished by providing the dopant at the surface in either liquid or gaseous form, and then thermally treating the base semiconductor to cause the dopant atoms to diffuse inward. Ion implantation, possibly with further heat treatment, is also used for surface doping. In some implementations, the n-type material and/or the p-type material can each respectively be comprised of regions having varying levels of relative dopant concentration. Regions having enhanced amounts of dopant are conventionally denoted as n−, n+, n++, and p−, p+, p++, indicating regions in order of increasing doping levels.

When the cell is illuminated by electromagnetic radiation of an appropriate wavelength, such as sunlight, a potential (voltage) difference develops across the p-n junction as the electron-hole pair charge carriers migrate into the electric field region of the junction and become separated. The spatially separated charge carriers are collected by electrodes in contact with the semiconductor at one or both surfaces. The cell is thus adapted to supply electric current to an electrical load connected to the electrodes, thereby providing electrical energy converted from the incoming solar energy that can do useful work. Since sunlight is almost always the light source, photovoltaic cells are commonly known as "solar cells." Ideally there is a low resistance connection between each electrode and the associated device and the electrode itself has high electrical conductivity, so that the efficiency of the source in converting incident light energy to usable electrical energy is maximized, with minimal ohmic losses within the device.

Industrial photovoltaic cells are commonly provided in the form of a planar structure, such as one based on a doped crystalline silicon wafer, that has been metallized, i.e., provided with electrodes in the form of electrically conductive metal contacts through which generated current can flow. Most commonly, these electrodes are provided on opposite sides of a generally planar cell structure. Conventionally, they are produced by applying suitable conductive metal pastes to the respective surfaces of the semiconductor body and thereafter firing the pastes to form a thin metal layer.

In the common planar p-base configuration, a negative electrode is located on the side of the cell that is to be exposed to a light source (the "front," "light-receiving," or "sun" side, which in the case of an ordinary solar cell is the side exposed to sunlight); a positive electrode is located on the other side of the cell (the "back" or "non-illuminated" side). For example, many commercial cells are constructed using a 200 µm thick p-type Si wafer with a 0.4 µm thick layer of n-type Si layer at the front surface. The p-type wafer is the base. The n-type layer is the emitter and is made by either diffusion or ion implantation of phosphorus (P) dopant into the Si wafer. Cells having a planar n-base configuration, in which the p- and n-type regions are interchanged from the p-base configuration, are also known. Solar-powered photovoltaic systems are considered to be environmentally beneficial in that they reduce the need for burning fossil fuels in conventional electric power plants.

Photovoltaic cells are commonly fabricated with an insulating layer on their front-side surface to afford an anti-reflective property that maximizes the utilization of incident light. However, in this configuration, a portion of the insulating layer normally must be removed to allow the overlaid front-side electrode to make contact with the underlying semiconductor. Conductive metal pastes appointed for fabricating front side electrodes typically include a glass frit and a conductive species (e.g., silver particles) carried in an organic medium that functions as a vehicle for printing. The electrode may be formed by depositing the paste composition in a suitable pattern (for instance, by screen printing) and thereafter firing the paste composition and substrate to dissolve or otherwise penetrate the insulating, anti-reflective layer and sinter the metal powder, such that an electrical connection with the semiconductor structure is formed.

The specific formulation of the paste composition has a strong but highly unpredictable effect on both the electrical and mechanical properties of electrodes constructed therewith. To obtain good electrical characteristics for the finished cell (e.g., high light conversion efficiency and filling fraction and low contact and source resistances), the composition must penetrate or etch fully through the anti-reflective layer during firing so that a good electrical contact is established, but without damaging the underlying semiconductor. However, it is also desired that a strongly adhering bond between the electrode and the substrate is formed upon firing. With many conventional paste compositions, it has not proven possible to reliably fire the printed wafers so that good adhesion and electrical properties are obtained concomitantly.

Although various methods and compositions useful in forming devices such as photovoltaic cells are known, there nevertheless remains a need for compositions that permit fabrication of patterned conductive structures that provide improved overall device electrical performance and that facilitate the rapid and efficient manufacture of such devices in both conventional and novel architectures.

SUMMARY

An embodiment of the present disclosure provides a paste composition for use in forming a conductive structure situated on a semiconductor substrate having an insulating layer on a major surface thereof, the paste composition comprising:

an inorganic solids portion that comprises:
(a) 93 to 99% by weight of the solids of a source of electrically conductive metal, and
(b) 1 to 7% by weight of the solids of an oxide-based fusible material, and an organic vehicle in which the constituents of the inorganic solids portion are dispersed, wherein the oxide-based fusible material comprises, by cation percent of the oxides:
20 to 35% PbO,
35 to 48% $TeO_2$,
5 to 12% $Bi_2O_3$,
3.5 to 6.5% $WO_3$,
0 to 2% $B_2O_3$,
10 to 20% $Li_2O$, and
0.5 to 8% $Na_2O$,
with the proviso that a ratio of the cation percentage of $TeO_2$ to the cation percentage of $WO_3$ in the fusible material ranges from 7.5:1 to 10:1, and wherein the paste composition, when deposited on the insulating layer and fired, is capable of penetrating the insulating layer and forming the conductive structure electrically connected to the semiconductor substrate.

A further embodiment provides a process for forming an electrically conductive structure, comprising:

(a) providing a semiconductor substrate having first and second major surfaces and a first insulating layer situated on the first major surface;

(b) applying the foregoing paste composition onto at least a portion of the first insulating layer, and (c) firing the semiconductor substrate, the first insulating layer, and the paste composition, such that the first insulating layer is penetrated, the conductive structure is formed, and an electrical connection is established between the conductive structure and the semiconductor substrate.

Also disclosed are articles that are formed using the present paste composition in the practice of the foregoing processes. Such articles include semiconductor devices and photovoltaic cells. The present processes can be used to form electrodes contacting silicon semiconductors, the electrodes comprising electrically conductive structures formed by any of the processes described herein. The present paste composition and processes are especially useful in forming electrodes on lightly doped Si wafers used in solar cells.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

Figure 1A:
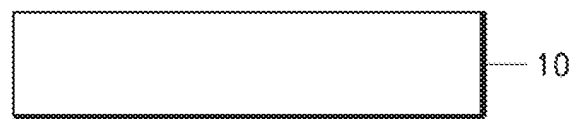
FIGS. 1A-1F illustrate successive steps of a process by which a semiconductor device may be fabricated. The device in turn may be incorporated into a photovoltaic cell. Reference numerals as used in FIGS. 1A-1F include the following.

10: p-type substrate;
12: first major surface (front or light-receiving side) of substrate 10;
14: second major surface (back side) of substrate 10;
20: n-type diffusion layer;
30: insulating layer;
40: p+ layer;
60: aluminum paste formed on back side;
61: aluminum back electrode (obtained by firing back-side aluminum paste);
70: silver or silver/aluminum paste formed on back side;
71: silver or silver/aluminum back electrode (obtained by firing back-side paste);
90: conductive paste as provided herein and formed on front side; and
91: conductive front electrode, formed by firing the front-side conductive paste).

DETAILED DESCRIPTION

Various aspects of the present disclosure relate to the need for high performance semiconductor and other electronic devices having mechanically robust and durable, high conductivity electrodes as well as processes suitable for their manufacture.

One aspect provides a paste composition that is useful in creating conductive structures used in such devices. The paste composition comprises a functional conductive component, such as a source of electrically conductive metal; an oxide-based fusible material; and an organic vehicle, which acts as a carrier for the inorganic constituents, which are dispersed therein. Along with solvent, the organic vehicle may include one or more components such as polymers, surfactants, thickeners, thixotropes, and binders that may impart desirable functional properties, including without limitation ones desirable in deposition and electrode formation processes.

In another aspect, the paste composition is beneficially employed in the fabrication of high-quality electrodes of photovoltaic devices. Ideally, the paste composition promotes the formation of a metallization that: (a) provides a relatively low resistance contact with the substrate; (b) preserves the electrical characteristics of the underlying substrate; and (c) adheres strongly to the underlying semiconductor substrate. Suitable paste compositions are believed to aid in etching surface insulating layers, which are ordinarily included in semiconductor structures such as photovoltaic cells, as required for making good contact between the conductive electrode and the underlying semiconductor.

Further embodiments provide a photovoltaic cell that includes one or more conductive structures made with the present paste composition. Such cells may provide in some implementations any combination of one or more of high photovoltaic conversion efficiency, high fill factor, low series resistance, and good mechanical adhesion between the electrode and the substrate.

Typically, electrodes or other like conductive traces are provided by screen printing the paste composition onto a substrate, although other forms of deposition may alternatively be used, including without limitation plating, extrusion or co-extrusion, dispensing from a syringe, inkjet, shaped, multiple, or ribbon printing. After deposition, the composition is fired at an elevated temperature. A separate drying step is optionally carried out prior to the actual firing.

The present composition is beneficially employed in manufacturing electrodes for conventional photovoltaic devices, as well as ones having alternative architectures. It is capable of making electrodes that provide a high-quality connection to lightly doped emitter (LDE) wafers, which are generally regarded as being problematic for previous pastes.

The present composition also can be used to form conductive traces for other purposes, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices and circuitry connected thereto.

I. Inorganic Components

A. Electrically Conductive Metal

The present paste composition includes a source of an electrically conductive metal. Exemplary metals include without limitation silver, gold, copper, nickel, palladium, platinum, aluminum, and alloys and mixtures thereof. In some embodiments, the electrically conductive metal is selected from the group consisting of Ag, Cu, and Pd; alternatively, the electrically conductive metal consists essentially of silver, which is beneficial for its processability and high conductivity. However, a composition including at least some non-precious metal may be used to reduce cost or to modify other properties.

The conductive metal may be incorporated directly in the present paste composition as a metal powder. In another embodiment, a mixture of two or more such metals or an alloy is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or $AgO$) or silver salts such as $AgCl$, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used in certain embodiments. Other metals used in the present paste for the functional conductive material may be similarly derived.

Electrically conductive metal powder used in the present paste composition may be supplied as finely divided particles having any morphology, including without limitation, any one or more of the following morphologies: a powder form, a flake form, a spherical form, a rod form, a granular form, a nodular form, a layered or coated form, other irregular forms, or mixtures thereof. Ordinarily, silver flakes are produced from larger particles by a grinding process, whereas particles that are approximately spherical arise from precipitation processes.

The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The particle size distribution may also be characterized by other parameters, such as $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments, Inc. (Irvine, Calif.), may also be used. In various embodiments, the median size of the metal particles is greater than 0.2 µm and less than 10 µm, or greater than 0.5 µm and less than 10 µm, or greater than 0.4 µm and less than 5 µm, or greater than 0.5 µm and less than 10 µm, as measured using the Horiba LA-910 analyzer.

In an embodiment, the solids portion of the present paste composition includes silver particles that are predominantly spherical and may have a relatively narrow size distribution. Alternatively, the particles may be a mixture of multiple size distributions and some or all of the particles may have different morphologies.

As further described below, the electrically conductive metal or a source thereof can be dispersed in an organic vehicle that acts as a carrier for the metal phase and other constituents present in the formulation. The electrically conductive metal may comprise any of a variety of percentages of the composition of the paste composition. To attain high conductivity in a finished conductive structure, it is generally preferable for the concentration of the electrically conductive metal to be as high as possible while maintaining other required characteristics of the paste composition that relate to either processing or final use, such as the need for a uniform, mechanically robust and adherent contact and adequate penetration of any surface passivation and/or anti-reflective coating present on the substrate. Minimizing the bulk resistivity and the contact resistance between the conductive structure and the underlying device beneficially tends to decrease the source resistance of a device.

In one embodiment, the electrically conductive metal or substance from which the metal is derived comprises from about 93 to about 99 wt % of the solid components of the thick-film paste composition. In further embodiments, the source of the electrically conductive metal comprises from about 93, 94, or 95 wt % to about 98 or 99 wt %, based on the solid components of the thick-film paste composition.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

B. Oxide-Based Fusible Material

The present paste composition comprises an oxide-based fusible material, which is understood to refer to a composition containing anions of one or more types, of which at least 80% are oxygen anions, and cations. In various embodiments, at least 90%, 95%, 98%, or substantially all the anions of the oxide component are oxygen anions.

The fusible material is typically in the form of a finely divided powder. The term "fusible," as used herein, refers to the ability of a material to become fluid upon heating, such as the heating employed in a firing operation. The fusible material may be either crystalline or partially or fully glassy or amorphous. In an embodiment, the fusible material herein is an oxide powder such as a glass frit, by which is meant a finely powdered glass material, which may result from a comminution operation.

In some embodiments, the fusible material is composed of one or more fusible subcomponents. That is, the oxide component may comprise either a single, homogeneously and intimately mixed material or plural constituent materials that have different, identifiable compositions. For example, the fusible material may comprise a glass material, or a mixture of two or more glass materials. It is to be understood that some mixed oxides, which are first fully melted (and thus intimately mixed), may phase segregate after cooling into a microstructure having grains, regions, or domains having different compositions. Such a microstructure is still to be regarded as having intimately mixed cations.

Intimate mixing at an atomic level is distinguished from a physical mixing. In the latter, plural constituent materials (each typically made up of macroscopic particles) remain differentiated throughout the entire preparation, e.g., as would result from the mixing different powders without melting them together at any point.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law.

It is to be understood that depending on its elemental content and preparation history, a fusible material that is partially or fully crystalline may comprise a single or multiple crystalline phase(s). A skilled person will recognize that melting and then solidifying a composition that does not correspond to a single crystalline phase in some instances may result in a microstructure having regions with different compositions and atomic structure, even though the various constituent elements initially were intimately mixed by complete melting. A powder X-ray diffraction pattern of such a re-solidified material would exhibit a superposition of the peaks corresponding to the crystalline phases therein. The re-solidified material is regarded as being a homogeneous, intimate mixture, even if it has a polycrystalline microstructure wherein grains of the two crystalline constituents are identifiably present, albeit intermingled, as long as the constituent atoms are intimately chemically mixed during the melting operation.

A median particle size of the fusible material in the present composition may be in the range of about 0.5 to 10 μm, or about 0.8 to 5 μm, or about 1 to 3 μm, as measured using the Horiba LA-910 analyzer.

In various embodiments, the thick film paste may include the oxide composition in an amount of 1 to 7%, 1.5 to 5%, 1.5 to 4%, or 2 to 3.5% by weight based on solids.

Fusible Material

In an embodiment, a lead-tellurium-oxide (Pb—Te—O) composition oxide-based composition usefully incorporated in the present paste composition as a fusible material comprises, consists essentially of, or consists of:
  20 to 35% PbO,
  35 to 48% $TeO_2$,
  5 to 12% $Bi_2O_3$,
  3.5 to 6.5% $WO_3$,
  0 to 2% $B_2O_3$,
  10 to 20% $Li_2O$, and
  0.5 to 8% $Na_2O$, based on cation percentage of the oxides, and with the proviso that a ratio of the cation percentage of $TeO_2$ to the cation percentage of $WO_3$ in the fusible material ranges from 7.5:1, 8:1, 8.5:1, or 9:1 to 10:1. The Pb—Te—O composition may be prepared from a mixture of oxide powders that in combination provide the composition above.

In some embodiments, the Pb—Te—O composition further comprises at least one additional constituent including, without limitation, any of $TiO_2$, $SiO_2$, $K_2O$, $Rb_2O$, $Cs_2O$, $Al_2O_3$, MgO, CaO, SrO, BaO, $V_2O_5$, $ZrO_2$, $HfO_2$, $MoO_3$, $Ta_2O_5$, $RuO_2$, $Mn_2O_3$, $Ag_2O$, ZnO, $Ga_2O_3$, $GeO_2$, $In_2O_3$, $SnO_2$, $Sb_2O_3$, $P_2O_5$, CuO, NiO, $Cr_2O_3$, $Fe_2O_3$, CoO, $CoO_2O_3$, $CO_3O_4$, $Y_2O_3$, the lanthanide oxides, or mixtures thereof. (The term "lanthanide" is understood to refer collectively to the elements of the periodic table having atomic numbers of 57 through 71, i.e., La—Lu.) In another embodiment, the additional constituent is one or more of $SiO_2$, $Ag_2O$, ZnO, $P_2O_5$, $V_2O_5$, $Al_2O_3$, MgO, $TiO_2$, $Cr_2O_3$, CuO, or $ZrO_2$. The aggregate amount of these additional constituents may range from a lower limit to an upper limit, wherein the lower limit is 0, 0.25, 0.5, 1, 2, or 5 wt % and the upper limit is 7.5, 10, or 15 wt % based on the total Pb—Te—O composition.

In an embodiment, Pb—Te—O glass compositions containing $Li_2O$ have been found effective in enabling the glass to etch through $SiN_x$:$H_y$, and like passivation or anti-reflective layers on solar cell wafers. The other alkali metal oxides ($Na_2O$, $K_2O$, $Cs_2O$, and $Rb_2O$) are typically less effective etchants, though they may enhance other properties of the glass and so can be included beneficially as well. In various embodiments, the total alkali metal oxide content may be 0 to 5 wt %, 0.1 to 3 wt %, or 0.25 to 3 wt %.

In an embodiment, the Pb—Te—O may include a combination of two or more different powders; separately, these powders may have different compositions, and may or may not be within the ranges described above; however, the combination of these powders may be within the ranges described above. For example, the Pb—Te—O composition may include one powder which includes a homogenous powder including some but not all of the elements of the group Pb, Te, Bi, W, B, Li, Na, and O, and a second homogeneous powder, which includes a different one or more of the foregoing elements, or the same elements in a different proportion, with the elements of the two powders collectively satisfying the foregoing compositional ranges. Also contemplated are compositions that include a Pb—Te—O composition satisfying the foregoing ranges and an additional fusible material having a different composition. For example, different fusible materials contained in the present composition may have different thermal behavior, such as different softening and/or glass transition temperatures.

Preparation and Characterization of Fusible Material

In an embodiment, the present fusible material may be produced by conventional glass-making techniques and equipment. For example, the ingredients may be weighed and mixed in the requisite proportions and then heated in a platinum alloy crucible in a furnace. The ingredients may be heated to a peak temperature (e.g., a temperature in the range 800° C. to 1400° C., or 1000° C. to 1200° C., or 900° C. to 1100° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are homogeneously and intimately mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into a suitable quench fluid. The resulting particles are then milled to form a powder or frit, which typically may have a $d_{50}$ of 0.2 to 3.0 µm.

Other production techniques may also be used. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

Any size-reduction method known to those skilled in the art can be employed to reduce particle size of the constituents of the present paste composition to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

One of ordinary skill in the art of glass chemistry would recognize that the fusible materials herein are described as including percentages of certain components. Specifically, the composition of these substances are specified by denominating individual components that may be combined in the specified percentages to form a starting material that subsequently is processed, e.g., as described herein, to form a glass or other fusible material. Such nomenclature is conventional to one of skill in the art. In other words, the fusible materials contain certain components, and the percentages of those components may be expressed as weight percentages of the corresponding oxide or other forms.

Alternatively, some of the compositions herein are set forth by cation percentages, which are based on the total cations contained in the particular material, unless otherwise indicated by the context. Of course, compositions thus specified include the oxygen or other anions associated with the various cations in the amounts required for charge balance. A skilled person would recognize that compositions could equivalently be specified by weight percentages of the constituents, and would be able to perform the required numerical conversions.

A skilled person would further recognize that any of the fusible materials herein, whether specified by weight percentages, molar percentages, or cation percentages, e.g. of the constituent oxides, may alternatively be prepared by supplying the required anions and cations in requisite amounts from different components that, when mixed and fired, yield the same overall composition. For example, in various embodiments, lithium for the compound $Li_2O$ could be supplied either from the oxide directly or alternatively from a suitable organic or inorganic lithium-containing compound (such as $Li_2CO_3$) that decomposes on heating to yield $Li_2O$. The skilled person would also recognize that a certain portion of volatile species, e.g., carbon dioxide, may be released during the process of making a fusible material.

It is known to those skilled in the art that the cations of some of the oxides described herein exist in more than one stable valence or oxidation state. For example, cobalt may exist in multiple possible oxidation states, with cobalt(II), cobalt(III), and cobalt(II,III) oxides, respectively having formulas $CoO$, $Co_2O_3$, and $Co_3O_4$, being reported. Fusible materials herein that include such cations can be prepared using any of the known oxides, or compounds that form oxides upon heating in air.

Although oxygen is typically the predominant anion in both the fusible materials of the present paste composition, some portion of the oxygen may be replaced chemically by fluorine or other halogen anions to alter certain properties, such as chemical, thermal, or rheological properties, of the oxide component that affect firing. In an embodiment, up to 10% of the oxygen anions of the oxide composition in any of the formulations of the present paste composition are replaced by one or more halogen anions, including fluorine. For example, up to 10% of the oxygen anions may be replaced by fluorine. Halogen anions may be supplied from halides of any of the composition's cations, that may be substituted for some portion of the corresponding oxide in the formulation.

A skilled person would also recognize that a fusible material such as one prepared by a melting technique as described herein may be characterized by known analytical methods that include, but are not limited to: Inductively Coupled Plasma-Emission Spectroscopy (ICP-ES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mossbauer spectroscopy, electron microprobe Energy Dispersive Spectroscopy (EDS), electron microprobe Wavelength Dispersive Spectroscopy (WDS), and Cathodoluminescence (CL). A skilled person could calculate percentages of starting components that could be processed to yield a particular fusible material, based on results obtained with such analytical methods.

Additives

The present paste composition may further comprise an optional discrete oxide additive. It is contemplated that the additive may comprise an oxide of one element, two or more discrete oxides of various elements, or a discrete mixed oxide of multiple elements. As used herein, the term "oxide of an element" includes both the oxide compound itself and any other organic or inorganic compound of the element, or the pure element itself if it oxidizes or decomposes on heating to form the pertinent oxide. Such compounds known to decompose upon heating include, but are not limited to, carbonates, nitrates, nitrites, hydroxides, acetates, formates, citrates, and soaps of the foregoing elements, and mixtures thereof. For example, Zn metal, zinc acetate, zinc carbonate, and zinc methoxide are potential additives that would oxidize or decompose to form zinc oxide upon firing. The oxide is discrete, in that it is not mixed at an atomic level with the base lead-tellurium-containing oxide, but is separately present in the paste composition. In an embodiment, the discrete oxide additive may be present in the paste composition in an amount ranging from 0.01 to 5 wt. %, or 0.05 to 2.5 wt. %, or 0.1 to 1 wt. %, based on the total weight of the paste composition. The additive can be included as particles of any size, as long as they can be incorporated into the present paste composition and provide its required functionality.

Possible additive materials include $TiO_2$, $SiO_2$, $Al_2O_3$, $MgO$, $V_2O_5$, $ZrO_2$, $B_2O_3$, $MoO_3$, $WO_3$, $Mn_2O_3$, $Ag_2O$, $ZnO$, $Ga_2O_3$, $GeO_2$, $Bi_2O_3$, $Li_3PO_4$, $Li_2CO_3$, $Li_2WO_4$, $Na_2CO_3$, $CuO$, $NiO$, $Cr_2O_3$, $Fe_2O_3$, $CoO$, $Co_2O_3$, and $Co_3O_4$. Another additive that has been found useful is a lithium ruthenium oxide, as set forth in U.S. Pat. No. 8,808,581 to VerNooy et al., which is incorporated herein by reference thereto for all purposes.

II. Organic Vehicle

The inorganic components of the present composition are typically mixed with an organic vehicle to form a relatively viscous material referred to as a "paste" or an "ink" that has a consistency and rheology that render it suitable for printing processes, including without limitation screen printing.

The organic vehicle typically provides a medium in which the inorganic components are dispersible with a good degree of stability of the chemical and functional properties of the paste composition. In particular, the paste composition preferably has a stability compatible not only with the requisite manufacturing, shipping, and storage, but also with conditions encountered during deposition, e.g., by a screen printing process. Ideally, the rheological properties of the vehicle are such that it lends good application properties to the paste composition, including stable and uniform dispersion of solids, appropriate viscosity and thixotropy for printing, appropriate wettability of the paste solids and the substrate on which printing will occur, a rapid drying rate after deposition, and stable firing properties. As defined herein, the organic medium is not considered to be part of the inorganic solids comprised in the thick-film paste composition.

A wide variety of inert materials can optionally be admixed in an organic medium in the present paste composition including, without limitation, an inert, non-aqueous liquid that optionally contains thickeners, binders, and/or stabilizers. By "inert" is meant a material that may be removed by a firing operation without leaving any substantial residue and that has no other effects detrimental to the paste or the final conductor line properties.

Substances useful in the formulation of the organic vehicle of the present paste composition include, without limitation, any one or more of the substances disclosed in U.S. Pat. No. 7,494,607 and International Patent Application Publication No. WO 2010/123967 A2, both of which are incorporated herein in their entirety for all purposes, by reference thereto. The disclosed substances include ethyl cellulose, ethylhydroxyethyl cellulose, wood rosin and derivatives thereof, mixtures of ethyl cellulose and phenolic resins, cellulose acetate, cellulose acetate butyrate, polymethacrylates of lower alcohols, monoalkyl ethers of ethylene glycol, monoacetate ester alcohols, and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. The organic vehicle may also include naturally-derived ingredients such as various plant-derived oils, saps, resins, or gums. Any of the polymers above or other suitable polymers may be present in the organic vehicle in any effective amount. For example, the polymer may comprise 8 to 15 wt % of the organic composition, or 0.1 wt % to 5 wt % of the total paste composition.

A preferred ester alcohol is the monoisobutyrate of 2,2,4-trimethyl-1,3-pentanediol, which is available commercially from Eastman Chemical (Kingsport, Tenn.) as TEXANOL™. Some embodiments may also incorporate volatile liquids in the organic vehicle to promote rapid hardening after application on the substrate. Various combinations of these and other solvents are formulated to provide the desired viscosity and volatility. The present paste composition may be adjusted as needed to a predetermined, screen-printable viscosity, e.g., by adding additional solvent(s).

In an embodiment, the organic vehicle may include one or more components selected from the group consisting of: bis(2-(2butoxyethoxy)ethyl) adipate, dibasic esters, octyl epoxy tallate, isotetradecanol, and a pentaerythritol ester of hydrogenated rosin. The paste composition may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

Further ingredients optionally may be incorporated in the organic vehicle, such as thickeners, stabilizers, and/or other common additives known to those skilled in the art. The organic vehicle may be a solution of one or more polymers in a solvent. Additionally, effective amounts of additives, such as surfactants or wetting agents, may be a part of the organic vehicle. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

The organic medium may comprise volatile liquids to promote rapid hardening after application of the thick-film paste composition on a substrate.

The optimal amount of organic medium in the thick-film paste composition is dependent on the method of applying the paste and the specific organic medium used.

The proportions of organic vehicle and inorganic components in the present paste composition can vary in accordance with the method of applying the paste and the kind of organic vehicle used. In an embodiment, the present paste composition typically contains about 50 to 95 wt %, 76 to 95 wt %, or 85 to 95 wt %, of the inorganic components and about 5 to 50 wt %, 5 to 24 wt %, or 5 to 15 wt %, of the organic vehicle, and substances associated therewith.

Preparation of the Thick-Film Paste Composition

The present paste composition is typically produced by combining the ingredients with any convenient mechanical mixing system. The constituents may be combined in any order, as long as they are uniformly dispersed and the final formulation has characteristics such that it can be successfully applied during end use. Mixing methods that provide high shear may be useful.

III. Formation of Conductive Structures

A. Substrate

An aspect of the disclosure provides a process that may be used to form a conductive structure on a substrate. Ordinarily, the process first entails the fabrication of a precursor structure of any desired configuration, generally comprising the steps of providing the substrate and applying a paste composition onto it in a suitable pattern. Then the applied paste composition and the substrate are fired to produce the conductive structure, which is often termed a "metallization." Most commonly, the substrate is planar and relatively thin, thus defining opposing first and second major surfaces on its respective sides. The present paste composition may be used to form an electrode on one or both of these major surfaces.

B. Insulating Layer

In some embodiments, the present paste composition is used in conjunction with a substrate, such as a semiconductor substrate, having an insulating or passivation or anti-reflective layer situated on one or more of the substrate's major surfaces. The layer may comprise, without limitation, one or more components selected from aluminum oxide; titanium oxide; silicon nitride; $SiN_x:H_y$ (non-stoichiometric silicon nitride containing hydrogen for passivation during subsequent firing processing); silicon oxide; silicon nitride, oxide, or oxynitride containing carbon; and silicon oxide/titanium oxide. There may be a single, homogeneous layer or multiple sequential sub-layers of any of these materials. Silicon nitride and $SiN_x:H_y$ are widely used. Passivation layers between 1 and 200 nm thick are suitable for typical applications.

In implementations for fabricating photovoltaic cells, the insulating layer is typically structured to provide an anti-reflective property, to lower the amount of incident light that is reflected from the cell's surface. Reducing the amount of light lost to reflection improves the cell's utilization of the incident light and increases the electrical current it can generate. Thus, the insulating layer is often denoted as an anti-reflective coating (ARC). The thickness of the layer preferably is chosen to maximize the anti-reflective property in accordance with the layer material's composition and refractive index. For example, the insulating ARC layer may have a thickness of between 1 and 200 nm. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer. The present method optionally includes the step of forming the insulating layer on the semiconductor substrate prior to the application of the paste composition.

In some implementations of the present process, the paste composition is useful whether the insulating layer is specifically applied or naturally occurring. The paste's oxide and non-oxide components may act in concert to combine with, dissolve, or otherwise penetrate some or all of the thickness of any insulating layer material during firing.

C. Application

The present composition can be applied as a paste onto a preselected portion of a major surface of a semiconductor substrate in a variety of different configurations or patterns, depending on the device architecture and the particular substrate material used. The preselected portion may comprise any fraction of the total area of the major surface. The area covered may range from a small fraction up to substantially all of the area. In an embodiment, the paste is applied on a semiconductor substrate, which may be single-crystal, cast mono, multi-crystal, polycrystalline, or ribbon silicon, or any other semiconductor material.

The application can be accomplished using a variety of deposition processes, including screen printing and other exemplary deposition processes discussed above. In an embodiment, the paste composition may be applied over any insulating layer present on the pertinent major surface of the substrate.

The conductive composition may be deposited in any useful pattern. For example, the application of the conductive paste may be used to form a photovoltaic cell precursor, wherein the paste is deposited on a preselected portion of a semiconductor substrate in a configuration that is appointed to be converted by a firing operation into an electrically conductive structure that includes at least one electrode in electrical contact with the substrate. In an implementation, the at least one electrode is configured to be connected to outside electrical circuitry to which electrical energy is to be supplied.

The electrode pattern used for a front side electrode of a photovoltaic cell commonly includes a plurality of narrow grid lines or fingers extending from one or more larger bus bars. Such a pattern permits the current generated in the cell to be extracted from the front side without undue resistive loss, while minimizing the area obscured by the metallization, which inherently reduces the amount of incoming light energy that can be converted to electrical energy. Ideally, the features of the electrode pattern should be well defined, with a preselected thickness and shape, and have high electrical conductivity and low contact resistance with the underlying structure. Fingers that are uniform and have a high ratio of height to width are beneficial in increasing the effective conductor cross sectional area (thus decreasing electrical resistance) while minimizing the obscured area. In an embodiment, the width of the lines of the conductive fingers may be 20 to 200 µm; 25 to 100 µm; or 35 to 75 µm, or 15 to 35 µm. In an embodiment, the thickness of the lines of the conductive fingers may be 5 to 50 µm; 10 to 35 µm; or 15 to 30 µm.

D. Firing

A heat treatment operation often termed "firing" may be used in the present process to effect the formation of a conductive structure that provides a high-quality electrical contact with an underlying substrate, such as a semiconductor wafer in a PV (photovoltaic) cell. In this configuration, the conductive structure can thus function as an electrode for connecting the PV cell to an electrical load. A drying operation optionally precedes the firing operation, and is carried out at a modest temperature to harden the paste composition, which may comprise removing its most volatile organics.

The firing operation is believed to effect a substantially complete burnout of the organic vehicle from the deposited paste by volatilization and/or pyrolysis of the organic materials. While the present invention is not limited by any particular theory of operation, it is believed that during firing, the fusible material acts to efficiently penetrate the insulating layer normally present on the wafer, such as a naturally-occurring or intentionally formed passivation layer and/or an anti-reflective coating. Such a result is frequently termed "firing through." The various paste components are also thought to promote sintering of the metal powder, e.g. silver, that provides the needed conductivity.

Ideally, the firing process results in a substantially complete removal of the insulating layer without further combination with the underlying Si substrate or the formation of substantial amounts of non-conducting or poorly conducting inclusions. It is further desired that the firing provide a conductive structure that has good electrical properties, including a high bulk conductivity and a low surface resistivity connection to the underlying semiconductor material, thereby reducing the source impedance of the cell. While some embodiments may function with electrical contact that is limited to conductive domains dispersed over the printed area, it is preferred that the contact be uniform over substantially the entire printed area. It is also beneficial for the conductive metal structure to be mechanically robust and securely attached to the substrate, with a metallurgical bond being formed over substantially all the area of the substrate covered by the conductive element.

A contact thus formed would further enable screen-printed crystalline silicon solar cells to have reduced saturation current density at the front surface (J0e) and accompanying increased Voc and Jsc, and therefore improved solar cell performance. It is believed that a suitably formulated paste would promote other desirable electrode characteristics, including high bulk conductivity and the ability to form narrow, high-aspect-ratio contact lines in a metallization pattern to further reduce series resistance and minimize shading of incident light by the electrodes, as well as good adherence to the substrate.

In one embodiment, the set point temperature of the oven or furnace for the firing may be in the range between about 300° C. and about 1000° C., or between about 300° C. and about 525° C., or between about 300° C. and about 650° C., or between about 650° C. and about 950° C. The firing may be conducted using any suitable heat source, and may be performed in an atmosphere composed of air, nitrogen, an inert gas, or an oxygen-containing mixture such as a mixed gas of oxygen and nitrogen.

In an embodiment, the firing is accomplished using a belt furnace. The substrate bearing the printed paste composition pattern is placed on a belt that is conveyed through the furnace's hot zone at high transport rates, for example between about 100 to about 500 cm per minute, with resulting hold-up times between about 0.05 to about 5 minutes. Multiple temperature zones may be used to control the desired thermal profile in the furnace, and the number of zones may vary, for example, between 3 to 11 zones. The temperature of a firing operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

E. Semiconductor Device Manufacture

An embodiment of the present disclosure relates to a device structure comprising a substrate and a conductive electrode, which may be formed by the process described above.

Conductive structures as provided herein may be usefully employed in a wide range of electrical, electronic, and semiconductor devices. Without limitation, such devices include photodiodes, photovoltaic cells, and solar panels or other like articles, in which one or more conductive structures function as electrodes through which the device can be connected to other electrical circuitry. Devices that are individually or collectively fabricated using processes disclosed herein may be incorporated into larger structures, such as a solar panel including a plurality of interconnected photovoltaic cells.

Certain embodiments of the present paste composition are useful in fabricating electrodes of PV cells constructed on semiconductor wafers with a range of concentrations and profiles of both n- and p-type dopants, including ones in which an insulating layer, such as a silicon nitride layer present on a major surface of the substrate, must be penetrated to establish contact.

Commercial PV production was once dominated by cells constructed on so-called "highly doped emitter" (HDE) Si wafer substrates, but "lightly doped emitter" (LDE) wafers are increasingly of interest. These two classes of p-base wafers are distinguished by the dopant concentration in the emitter region. For example, HDE Si wafers having an emitter with total surface concentration of phosphorus $[P_{surface}]$ ranging from 9 to $15 \times 10^{20}$ atoms/cm$^3$ and/or active $[P_{surface}]$ ranging from 3 to $4 \times 10^{20}$ atoms/cm$^3$ have been widely used. At lower overall dopant concentrations, there is less difference between the total and active dopant surface concentrations. LDE wafers are understood herein as having emitters in which $[P_{surface}]$ is below $3 \times 10^{20}$ atoms/cm$^3$.

Total dopant concentration is typically measured using the SIMS (secondary ion mass spectrometry) depth profiling method. [See, e.g., Diffusion in Silicon, S. W. Jones, IC Knowledge LLC 2008 pages 56-62.] Active dopant concentration is often measured using SRP (spreading resistance probing) [Id., page 61] or ECV (electrochemical capacitance voltage [Id., page 57] methods. The total dopant concentration is also known to affect sheet resistivity at the emitter surface, with higher doping generally leading to decreased resistivity.

Dopant concentration has a significant impact on both the construction and operation of PV cells. Specifically, it has been found easier to fabricate electrodes that make good electrical contact on HDE wafers, but higher overall light conversion efficiency can in principle be obtained with LDE wafers.

As explained above, light incident on a PV cell produces electron-hole pair charge carriers. Useful electrical energy is obtained from those carriers that are collected at the cell's electrodes and pass through the electrical load connected to the cell. However, some of the carrier pairs never reach the electrodes, but instead are bound to the Si crystal lattice and recombine within the cell near the p-n junction. The energy from the incident light that created these pairs thus cannot be extracted as useful electrical energy. This dissipation is known as recombination loss; it typically increases as dopant levels in the emitter increase, which is believed to result from an increased level of crystalline defects or other electrical perturbations in the Si crystal lattice. P dopant in excess of the active concentration (inactive P) leads to Shockley-Read-Hall (SRH) recombination energy loss. An active P dopant concentration above $1 \times 10^{20}$ atoms/cm$^3$ leads to Auger recombination energy loss. Such losses are manifest in a decrease of both $V_{OC}$ (open circuit voltage) and $I_{SC}$ (short circuit current) in finished cells. The loss is higher for light at the short wavelength (blue) end of the visible solar spectrum, which is mostly absorbed very near the sun surface of the cell.

Solar cell embodiments employing LDE wafers in some instances achieve improved solar cell performance by decreasing the recombination losses. However, the inherent potential of LDE-based cells to provide improved cell performance often is not fully realized in practice because of the greater difficulty of forming the high-quality, low ohmic loss metal contacts needed to efficiently extract current from the operating cell, with surface dopant concentration being the dominant predictive factor. Metal contacts to LDE wafers have larger energy barriers to charge carrier tunneling than contacts to HDE wafers. The larger barriers in turn decrease tunneling current and increase contact resistivity.

Both resistive and recombination losses are deleterious, as both decrease the cell's efficiency in converting incident light energy into useful electrical energy, but the difficulty of making good contacts has impeded the evolution from HDE to LDE wafers for commercial solar cell production. An ideal thick film metallization paste would reliably contact an emitter with a low surface dopant concentration, but without damaging the emitter structure. A crystalline silicon solar cell having electrodes fabricated by screen-printing with such a paste could have reduced saturation current density at the front surface (Joe), so that $V_{OC}$ and $J_{SC}$, could be increased, leading to improved performance in service. Other desirable characteristics of a paste would include high bulk conductivity, the ability to form narrow, high-aspect-ratio finger lines in a metallization pattern to further reduce series resistance and minimize shading of incident light by the electrodes, and good adherence to the substrate.

Embodiments of the present paste composition are beneficially used in fabricating electrodes on LDE wafers in which $[P_{surface}]$ is at most $0.5 \times 10^{20}$, $0.6 \times 10^{20}$, $0.75 \times 10^{20}$, $1.0 \times 10^{20}$, $1.5 \times 10^{20}$, $1.75 \times 10^{20}$, $2.0 \times 10^{20}$, $2.5 \times 10^{20}$, or $3.0 \times 10^{20}$ atoms/cm$^3$.

One possible sequence of steps implementing the present process for manufacture of a photovoltaic cell device is depicted by FIGS. 1A-1F. While the process is described with reference to a p-base cell (either HDE or LDE) having a planar architecture, comparable steps useful in fabricating planar n-base cells or cells having other architectures will also be apparent.

FIG. 1A shows a p-type substrate 10, which may be any known type of Si including, without limitation, single-crystal, multi-crystalline, mono-crystalline, or polycrystalline silicon. For example, substrate 10 may be obtained by slicing a thin layer from an ingot that has been formed from a pulling or casting process. In an implementation, the Si ingot is doped with B to render it p-type. Surface damage and contamination (from slicing with a wire saw, for example) may be removed by etching away about 10 to 20 µm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Although not specifically depicted, substrate 10 may have a first major surface 12 that is textured to reduce light reflection. Texturing may be produced by etching a major surface with an aqueous alkali solution such as aqueous potassium hydroxide or aqueous sodium hydroxide. Substrate 10 may also be formed from a silicon ribbon.

Figure 1B:
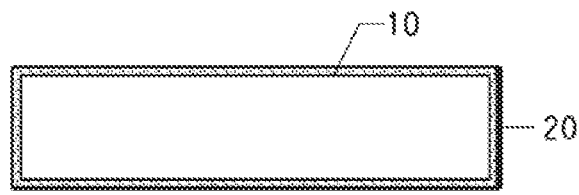

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride (POCl$_3$) or ion implantation. As shown, the n-type diffusion layer 20 is formed over the entire surface of the silicon p-type substrate. In other implementations, the diffusion layer is confined to the top major surface, obviating the need for the removal process described below. The depth of the diffusion layer can be varied by controlling the diffusion temperature and time, and is generally formed in a thickness range of about 0.3 to 0.5 µm. The n-type diffusion layer may have a sheet resistivity ranging from several tens of ohms per square up to about 120 ohms per square. In some alternative implementations (not shown), additional doping with B at a level above that of the bulk is added in a layer on second (rear) major surface 14.

Figure 1C:
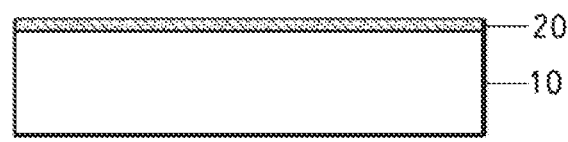

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
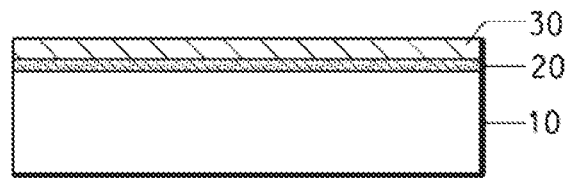

Next, as shown in FIG. 1D, an insulating layer 30, which also functions as an anti-reflective coating, is formed on the n-type diffusion layer 20. The insulating layer is commonly silicon nitride (SiN), but can also be a layer of another material, such as SiN$_x$:H (i.e., the insulating layer is non-stoichiometric SiN that comprises hydrogen for passivation during subsequent firing processing), titanium oxide, silicon oxide, mixed silicon oxide/titanium oxide, or aluminum oxide. In various embodiments, the insulating layer can be in the form of a single layer or multiple layers of the same or different materials.

Figure 1E:
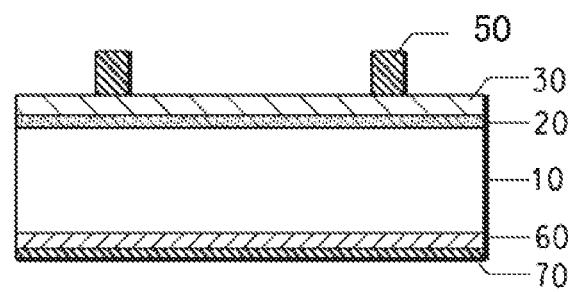

Next, electrodes are formed on both major surfaces 12 and 14 of the substrate. As shown in FIG. 1E, a paste composition 90 as provided herein is screen printed on the insulating layer 30 of the first major surface 12 and then dried. For a photovoltaic cell, paste composition 90 is typically applied in a predetermined pattern of conductive lines extending perpendicularly from one or more bus bars that occupy a predetermined portion of the surface. Aluminum paste 60 and back-side silver paste 70 are screen printed onto the back side (the second major surface 14 of the substrate) and successively dried.

The screen printing operations may be carried out in any order. For the sake of production efficiency, all these pastes are typically processed by co-firing them, typically at a temperature in the range of about 700° C. to about 975° C. for a period of from several seconds to several tens of minutes in air or an oxygen-containing atmosphere. An infrared-heated belt furnace is conveniently used for high throughput.

Figure 1F:
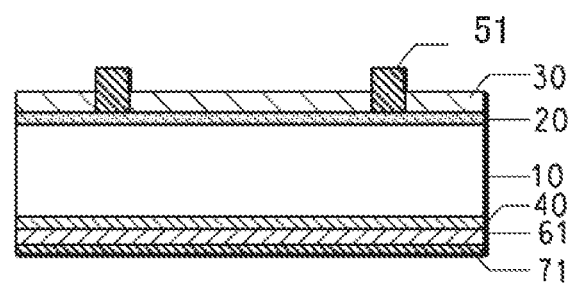

As shown in FIG. 1F, the firing causes the depicted paste composition 90 on the front side to sinter and penetrate through the insulating layer 30, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and the firing conditions. A high-quality fired-through state is believed to be an important factor in obtaining high conversion efficiency in a photovoltaic cell. Firing thus converts paste 90 into electrode 91, as shown in FIG. 1F.

The firing further causes aluminum to diffuse from the back-side aluminum paste 60 into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. It is believed that during firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, silver or silver/aluminum back electrode 71 is formed on the back side as an electrode to permit soldered attachment of interconnecting copper ribbons or the like. Although silver paste 70 is depicted as covering the same area as aluminum paste 60, it is sufficient for electrode 71 to cover a limited area that still accommodates this solder attachment.

A semiconductor device fabricated as described above may be incorporated into a photovoltaic cell. In another embodiment, a photovoltaic cell array includes a plurality of the aforementioned semiconductor devices as described. The devices of the array may be made using a process described herein.

E. Other Device Types and Architectures

Processes incorporating steps such as those described above are useful in constructing devices having other types or architectures.

For example, efforts have been made to improve the configuration depicted in FIG. 1F by replacing the conventional aluminum BSF layer 40, which can produce construction and operational deficiencies. In some instances, differential thermal expansion causes the layer 40 to warp the overall wafer excessively, which complicates handling during production and may even cause breakage. Layer 40 is also suboptimal as a reflection surface, as some amount of long wavelength light that otherwise could be reflected back into the wafer body for photoelectric conversion is lost, thus diminishing the overall device conversion efficiency. Aluminum BSF layers are also less effective in passivating the rear surface than other approaches.

One improved architecture commonly termed "PERC" (Passivated Emitter and Rear Cell) was proposed in 1989 in A. W. Blakers, et al., Applied Physics Letters, 55 (1989), pp. 1363-1365. The PERC architecture entails replacement of the aluminum BSF layer 40 with a dielectric layer comprised of one or more sublayers of materials similar to those used to provide front-side passivation and anti-reflection. Suitable materials include aluminum oxide; titanium oxide; silicon nitride; $SiN_x$:$H_y$; silicon oxide; silicon nitride, oxide, or oxynitride containing carbon; and silicon oxide/titanium oxide. Ideally, such a dielectric layer provides higher reflectivity and better rear passivation, thereby reducing recombination losses and improving utilization of long-wavelength incoming light. Then a laser ablation process is used to create a patterned opening in the dielectric layer. The openings are usually termed vias. The rear surface is screen printed with an Al-containing paste. During the firing process, Al melts in the via areas and locally dopes the underlying Si with p-type Al dopant, but the printed Al layer does not interact elsewhere with the underlying Si substrate in regions of unopened dielectric.

It will be apparent that similar processes can be used to fabricate conductive structures in photovoltaic cells having other architectures or other electrical, electronic, and semiconductor devices, all of which are contemplated within the scope of the present disclosure.

EXAMPLES

The operation and effects of certain embodiments of the present invention may be more fully appreciated from a series of examples (Examples 1-12) described below, and comparison of those examples with Comparative Examples CE1-CE6. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Example 1

Comparative Example 1

Oxide Component Preparation

Glass frits suitable for use in paste compositions herein are prepared by blending the requisite solid oxides or other suitable precursors (e.g., carbonates). The blend is then heated in a Pt crucible and held at a temperature sufficient to melt the constituents together, and thereafter is poured onto a stainless steel quench plate. The solidified mass is ground to coarse powder and then ball milled to attain a desired small particle size, such as a $d_{90}$ (measured using a Horiba LA-910 analyzer) of 2 to 3 µm. Typically, the milling is carried out in a polyethylene container with zirconia media and isopropyl alcohol or water optionally containing 0.5 wt % TRITON™ X-100 octylphenol ethoxylate surfactant (available from Dow Chemical Company, Midland, Mich.). The comminuted powder is recovered by centrifugation or filtration and then dried.

Glasses having nominal compositions designated as frits A through G and comparative frits CE-A through CE-C are made as thus described. The compositions are specified by weight percent of their oxide constituents in Table Ia and by cation percent in Table Ib. The calculated ratio by weight and cation percentages of the amounts of the $TeO_2$ and $WO_3$ constituents are given in the final columns of Tables Ia and Ib, respectively. Frits A through G are suitably incorporated in the present paste composition.

TABLE Ia

Frit Compositions (weight %)

| Frit No. | PbO | B2O3 | Na2O | Li2O | Bi2O3 | WO3 | TeO2 | Te/W |
|---|---|---|---|---|---|---|---|---|
| CE-A | 35.96 | 0.45 | 0.20 | 1.73 | 10.51 | 8.97 | 42.18 | 4.70 |
| CE-B | 36.13 | 0.45 | 0.00 | 1.73 | 10.47 | 7.15 | 44.08 | 6.17 |
| CE-C | 40.94 | 0.00 | 0.00 | 1.46 | 8.55 | 7.09 | 41.96 | 5.92 |
| A | 34.72 | 0.23 | 0.20 | 1.74 | 9.06 | 7.51 | 46.55 | 6.20 |
| B | 43.72 | 0.21 | 0.19 | 1.37 | 8.56 | 6.38 | 39.57 | 6.20 |
| C | 37.23 | 0.00 | 0.80 | 1.53 | 8.97 | 7.44 | 44.03 | 5.92 |
| D | 32.88 | 0.00 | 0.79 | 1.53 | 13.43 | 7.42 | 43.95 | 5.92 |
| E | 36.64 | 0.00 | 0.75 | 1.09 | 12.75 | 7.05 | 41.72 | 5.92 |
| F | 34.88 | 0.00 | 0.39 | 1.49 | 13.11 | 7.25 | 42.89 | 5.92 |
| G | 36.06 | 0.22 | 0.80 | 1.69 | 15.06 | 7.49 | 38.68 | 5.16 |

TABLE Ib

Frit Compositions (cation %)

| Frit No. | PbO | B2O3 | Na2O | Li2O | Bi2O3 | WO3 | TeO2 | Te/W |
|---|---|---|---|---|---|---|---|---|
| CE-A | 25.00 | 2.00 | 1.00 | 18.00 | 7.00 | 6.00 | 41.00 | 6.83 |
| CE-B | 25.20 | 2.00 | 0.00 | 18.00 | 7.00 | 4.80 | 43.00 | 8.96 |
| CE-C | 30.00 | 0.00 | 0.00 | 16.00 | 6.00 | 5.00 | 43.00 | 8.60 |
| A | 24.00 | 1.00 | 1.00 | 18.00 | 6.00 | 5.00 | 45.00 | 9.00 |
| B | 32.00 | 1.00 | 1.00 | 15.00 | 6.00 | 4.50 | 40.50 | 9.00 |
| C | 26.00 | 0.00 | 4.00 | 16.00 | 6.00 | 5.00 | 43.00 | 8.60 |
| D | 23.00 | 0.00 | 4.00 | 16.00 | 9.00 | 5.00 | 43.00 | 8.60 |
| E | 27.00 | 0.00 | 4.00 | 12.00 | 9.00 | 5.00 | 43.00 | 8.60 |

TABLE Ib-continued

| Frit No. | Frit Compositions (cation %) | | | | | | | |
|---|---|---|---|---|---|---|---|---|
| | PbO | B2O3 | Na2O | Li2O | Bi2O3 | WO3 | TeO2 | Te/W |
| F | 25.00 | 0.00 | 2.00 | 16.00 | 9.00 | 5.00 | 43.00 | 8.60 |
| G | 25.00 | 1.00 | 4.00 | 17.50 | 10.00 | 5.00 | 37.50 | 7.50 |

Examples 2-5

Comparative Examples CE2-CE4

Paste compositions suitably employed in the construction of front-side electrodes are prepared by combining and mechanically mixing the requisite amounts of the inorganic solids, including glass frits as described in Example 1 above and a suitable Ag powder, and an organic vehicle.
Silver Powder The paste compositions of Examples 2-5 and Comparative Examples CE3-CE4 are prepared with a mixture of: (a) 90% by weight of an Ag powder that is finely divided, with a predominantly spherical shape, with a particle size distribution having a $d_{50}$ of about 2 μm (as measured in an isopropyl alcohol dispersion using a Horiba LA-910 analyzer) and (b) 10% by weight of an Ag powder with a predominantly spherical shape and a $d_{50}$ of about 0.6 μm. Comparative Example CE2 is prepared with only the foregoing 2 μm Ag powder.
Organic Vehicle The organic vehicle may be prepared as a masterbatch using a planetary, centrifugal Thinky® mixer (available from Thinky® USA, Inc., Laguna Hills, Calif.) to mix the ingredients. A suitable formulation is listed in Table II below, with percentages given by weight. TEXANOL™ ester alcohol solvent is available from Eastman Chemical Company, Kingsport, Tenn. In some implementations, certain of the vehicle components (e.g., resin or cellulose) are optionally first mixed with a portion of the solvent and heated to effect dissolution and thereafter added to the remainder of the masterbatch. A small percentage of the nominal solvent content is typically held back to permit later viscosity adjustment, as further described below.

TABLE II

Organic Vehicle Composition

| Ingredient | wt % |
|---|---|
| 11% ethyl cellulose (50-52% ethoxyl) dissolved in TEXANOL ™ solvent | 8.4% |
| 8% ethyl cellulose (48-50% ethoxyl) dissolved in TEXANOL ™ solvent | 8.4% |
| Tallowpropylenediaminedioleate | 5.7% |
| pentaerythritol ester of hydrogenated rosin | 29.6% |
| gum damar | 4.3% |
| hydrogenated castor oil derivative | 5.7% |
| dibasic ester | 29.6% |
| aromatic solvent | 1.4% |
| TEXANOL ™ solvent | (balance) |

Paste Preparation

Paste compositions for Examples 2-5 and Comparative Examples CE2-CE5 are listed in Table III.

Typically, the inorganic solids, including the oxide component and the Ag powder, are first combined by tumble-mixing them in a glass jar for about 15 min. This mixture is then added by thirds to a jar containing organic vehicle from the aforementioned masterbatch and mixed after each addition using the aforementioned Thinky® mixer for 1 minute at 2000 RPM, whereby the solid ingredients are well dispersed in the organic vehicle.

After the final addition, the paste is cooled and the viscosity is adjusted to between about 300 and 400 Pa-s by adding solvent and Thinky mixing for 1 minute at 2000 RPM. The paste is then passed repeatedly through a three-roll mill (for example, a three-roll mill by Charles Ross and Son, Hauppauge, N.Y., with a 25 μm gap, using 3 passes at zero pressure and 3 passes at 100 psi (0.7 MPa)).

Each paste composition is allowed to sit for at least 16 hours after roll milling, and then its viscosity is adjusted to ~300 Pa-s with additional TEXANOL™ solvent to render it suitable for screen printing. Viscosity is conveniently measured using a Brookfield viscometer (Brookfield Inc., Middleboro, Mass.) with a #14 spindle and a #6 cup. Viscosity values may be taken after 3 minutes at 10 RPM. Typically, a viscosity of about 300 Pa-s is found to yield good screen printing results, but some variation, for example ±50 Pa-s or more, would be acceptable, depending on the precise printing parameters.

The degree of dispersion of each paste composition may be measured using commercial fineness of grind (FOG) gauges (Precision Gage and Tool, Dayton, Ohio) in accordance with ASTM Standard Test Method D 1210-05. FOG values are conventionally specified as X/Y, meaning that the size of the largest particle detected is X μm and the median size is Y μm. FOG values of 15/8 or better are typically attained for the present paste composition.

The foregoing process is determined to produce paste composition material that is sufficiently homogeneous to achieve reproducible solar cell performance.
Cell Fabrication Generally stated, electrodes for the exemplary photovoltaic cells below are formed by screen printing the desired paste composition in a preselected pattern onto the front side of a nominal six inch, p-type thin silicon wafer having an n-type emitter with a $[P_{surface}]$ value of about $2.4 \times 10^{20}$ atoms/cm$^3$, using a screen printer, such as a Baccini screen printer available from Applied Materials, Inc., Santa Clara, Calif. The front-side electrodes are formed in a comb-like pattern comprising a large number of fingers extending perpendicularly from bus bars (hereinafter, "bus bar/finger" configuration). The back-side electrodes are formed by screen printing Solamet® PV36S Al-containing paste (available commercially from E. I. duPont de Nemours and Company, Wilmington, Del.) or equivalent to produce a full-plane Al—Si eutectic back contact upon firing. After printing and drying, the cells are fired in a rapid thermal processing, multi-zone belt furnace, such as one provided by Despatch, Minneapolis, Minn.
Electrical Testing The electrical properties reported herein may be measured using a Halm solar cell tester, available from h.a.l.m. elektronik GmbH, Frankfurt am Main, Germany. A Xe arc lamp in the I-V tester simulates sunlight with a known intensity and irradiates the front surface of the cell. Tests are carried out on photovoltaic cells at 25±1.0° C. with a light intensity of 1.0 Sun. The tester uses a four contact method to measure current (I) and voltage (V) at multiple load resistance settings to determine the cell's I-V curve. Light energy conversion efficiency (Eff), fill factor (FF), and apparent series resistance ($R_a$) are obtained from the I-V curve for each cell. $R_a$ is defined in a conventional manner as the negative of the reciprocal of the local slope of the I-V curve near the open circuit voltage. As recognized by a person of ordinary skill, $R_a$ is conveniently determined and a close approximation for $R_s$, the true series resistance of the cell.

Measurements of specific contact resistance $\rho_c$ (expressed in units of ohms per unit area) are made using a conventional method known in the art as the Transmission Line (or Transfer Length) Method (TLM), as described in Janoch et al., "Contact Resistance Measurement—Observations on Technique and Test Parameters," 42nd IEEE Photovoltaic Specialists Conference, Jun. 14-19, 2015, New Orleans, La.

Electrical tests are carried out after the firing of the photovoltaic cells. For each example, a test group of at least 3 cells is fired in a given furnace cycle, with electrical data being reported as means within the test group. For each furnace condition and run cycle, control cells are made with known commercial wafer samples and conductive pastes. The control cells are included in each firing and thereafter tested. The processing and electrical testing are assumed valid as long as the results for the control cells are within established limits. Of course, the foregoing protocols are exemplary and other equipment and procedures suitable for heat treating and testing efficiencies and other pertinent electrical properties will be recognized by one of ordinary skill in the art.

Electrical test results for cells made using the paste compositions of Examples 2-5 and Comparative Examples CE2-CE4 are provided in Table III.

TABLE III

Paste Compositions and PV Cell Properties

| Example | Frit No. | Frit (wt. %) | Eff (%) | FF (%) | Ra (Ω) | Voc (V) | $\rho_c$ (Ω/cm$^2$) |
|---|---|---|---|---|---|---|---|
| CE2 | CE-A | 1.80% | 20.30 | 79.46 | 0.563 | 0.6559 | 1.036 |
| CE3 | CE-B | 2.40% | 20.29 | 79.45 | 0.556 | 0.6550 | 1.139 |
| CE4 | CE-C | 2.40% | 20.34 | 79.44 | 0.570 | 0.6556 | 1.054 |
| 2 | C | 2.40% | 20.38 | 79.72 | 0.513 | 0.6552 | 0.733 |
| 3 | D | 2.40% | 20.37 | 79.67 | 0.511 | 0.6551 | 0.618 |
| 4 | E | 2.40% | 20.34 | 79.49 | 0.556 | 0.6557 | 0.965 |
| 5 | F | 2.40% | 20.32 | 79.54 | 0.538 | 0.6551 | 0.865 |

It is seen that the cells of Examples 2-5, which have front-side electrodes constructed with the paste composition of the present disclosure, beneficially exhibit higher light energy conversion efficiency (Eff), filling factor (FF), and apparent series resistance ($R_a$) and lower contact resistivity ($\rho_c$) than do the cells of Comparative Examples CE 2-CE4 whose electrodes are fabricated using paste compositions with the comparative frits. Open circuit voltage ($V_{OC}$) values are comparable. The decrease in $\rho_c$ is especially notable, since it has generally been regarded heretofore that $\rho_c$ can only be decreased by firing at higher temperatures that deleteriously causes emitter damage that results in decreased efficiency.

Examples 6-12

Comparative Examples CE5-CE6

The foregoing examples and comparative examples are extended by constructing and testing additional photovoltaic cells using paste compositions with varying frit loading, as listed in Table IV. The paste compositions of Examples 6-12 and Comparative Example CE6 are made with the same 90%/10% mixture of Ag powders used for Examples 2-5. The paste composition of Comparative Example CE5 is made with 100% of the same 2 μm powder as Comparative Example CE2. As before, cells having electrodes made with paste composition of the present disclosure exhibit electrical properties superior to those made with pastes that include the prior frits. It is further seen that for Examples 10-15, efficiency is higher at a 2.4% frit loading than at 2.1% or 2.7%.

TABLE IV

Paste Compositions and PV Cell Properties

| Example | Frit No. | Frit (wt. %) | Eff (%) | FF (%) | Ra (Ω) | Voc (V) | $\rho_c$ (Ω/cm$^2$) |
|---|---|---|---|---|---|---|---|
| CE5 | CE-A | 1.80% | 20.31 | 79.36 | 0.553 | 0.6572 | 1.841 |
| CE6 | CE-B | 2.40% | 20.26 | 79.19 | 0.587 | 0.6560 | 2.544 |
| 6 | A | 2.40% | 20.32 | 79.50 | 0.525 | 0.6563 | 1.093 |
| 7 | C | 2.10% | 20.32 | 79.39 | 0.547 | 0.6566 | 1.376 |
| 8 | C | 2.40% | 20.39 | 79.47 | 0.517 | 0.6567 | 1.610 |
| 9 | C | 2.70% | 20.29 | 79.48 | 0.532 | 0.6553 | 1.160 |
| 10 | D | 2.10% | 20.32 | 79.49 | 0.538 | 0.6566 | 0.898 |
| 11 | D | 2.40% | 20.36 | 79.47 | 0.526 | 0.6564 | 0.913 |
| 12 | D | 2.70% | 20.31 | 79.54 | 0.514 | 0.6554 | 0.954 |

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

The presence of the impurities would not substantially alter the chemical and rheological properties of the oxide component, the fusible materials therein, paste compositions made with the oxide, or the electrical properties of a fired device manufactured using the paste composition. For example, a solar cell employing a conductive structure made using the present paste composition may have the efficiency and other electrical properties described herein, even if the paste composition includes impurities.

The embodiments of the oxide compositions and the constituent fusible materials described herein, including the examples herein, are not limiting; it is contemplated that one of ordinary skill in the art of glass chemistry could make minor substitutions of additional ingredients and not substantially change the desired properties of the oxide composition, including its interaction with a substrate and any insulating layer thereon.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A paste composition for use in forming a conductive structure situated on a semiconductor substrate having an insulating layer on a major surface thereof, the paste composition comprising:
    an inorganic solids portion that comprises:
        (a) 93 to 99% by weight of the solids of a source of electrically conductive metal, and
        (b) 1 to 7% by weight of the solids of an oxide-based fusible material, and
    an organic vehicle in which the constituents of the inorganic solids portion are dispersed,
    wherein the oxide-based fusible material comprises, by cation percent of the oxides:
        20 to 35% PbO,
        35 to 48% $TeO_2$,
        5 to 12% $Bi_2O_3$,
        3.5 to 6.5% $WO_3$,
        0 to 2% $B_2O_3$,
        10 to 20% $Li_2O$, and
        0.5 to 8% $Na_2O$,
        with the proviso that a ratio of the cation percentage of $TeO_2$ to the cation percentage of $WO_3$ in the fusible material ranges from 7.5:1 to 10:1,
    and wherein the paste composition, when deposited on the insulating layer and fired, is capable of penetrating the insulating layer and forming the conductive structure electrically connected to the semiconductor substrate.

2. The paste composition of claim 1, wherein the electrically conductive metal comprises silver.

3. The paste composition of claim 1, wherein the oxide-based fusible material further comprises at least one of $TiO_2$, $SiO_2$, $K_2O$, $Rb_2O$, $Cs_2O$, $Al_2O_3$, MgO, CaO, SrO, BaO, $V_2O_5$, $ZrO_2$, $HfO_2$, $MoO_3$, $Ta_2O_5$, $RuO_2$, $Mn_2O_3$, $Ag_2O$, ZnO, $Ga_2O_3$, $GeO_2$, $In_2O_3$, $SnO_2$, $Sb_2O_3$, $P_2O_5$, CuO, NiO, $Cr_2O_3$, $Fe_2O_3$, CoO, $Co_2O_3$, $Co_3O_4$, $Y_2O_3$, the lanthanide oxides, or a mixture thereof.

4. The paste composition of claim 1, wherein the oxide-based fusible material comprises a combination of at least two powders having different compositions.

5. The paste composition of claim 1, further comprising a discrete oxide additive.

6. The paste composition of claim 1, wherein the semiconductor substrate is configured to be formed into a photovoltaic device having a lightly doped n-type emitter in the major surface and a p-type base.

7. The paste composition of claim 1, wherein the lightly doped n-type emitter has a surface P dopant concentration of less than $3 \times 10^{20}$ atoms/cm$^3$.

8. A process for forming a conductive structure, comprising:
    (a) providing a semiconductor substrate having first and second major surfaces and a first insulating layer situated on the first major surface;
    (b) applying a paste composition as recited by claim 1 onto at least a portion of the first insulating layer, and
    (c) firing the semiconductor substrate, the first insulating layer, and the paste composition, such that the first insulating layer is penetrated, the conductive structure is formed, and an electrical connection is established between the conductive structure and the semiconductor substrate.

9. The process of claim 8, wherein the semiconductor substrate is configured to be formed into a device having a lightly doped n-type emitter presented at the first major surface and a p-type base presented at the second major surface.

10. The process of claim 9, wherein the lightly doped emitter comprises P-doped Si in which a bulk concentration of P atoms is less than $3 \times 10^{20}$ atoms/cm$^3$.

11. The process of claim 8, wherein the semiconductor substrate further comprises a second insulating layer situated on the second major surface, a portion of the second insulating layer defining a patterned opening region is removed, an aluminum-containing paste composition is applied onto the second insulating layer, and during the firing, aluminum from the paste composition interacts with silicon to produce a localized back surface field in the patterned opening region, whereby a second conductive structure is formed and an electrical connection is established between the second conductive structure and the semiconductor substrate at the second major surface.

12. The process of claim 11, wherein the aluminum-containing paste composition is applied onto substantially all the second insulating layer.

13. A conductive structure made by the process of claim 8.

14. A conductive structure made by the process of claim 9.

15. A conductive structure made by the process of claim 10.

\* \* \* \* \*